United States Patent
Gopalan et al.

(10) Patent No.: US 11,355,325 B2
(45) Date of Patent: Jun. 7, 2022

(54) METHODS AND SYSTEMS FOR MONITORING INPUT POWER FOR PROCESS CONTROL IN SEMICONDUCTOR PROCESS SYSTEMS

(71) Applicant: APPLIED MATERIALS, INC., Santa Clara, CA (US)

(72) Inventors: Ramesh Gopalan, Fremont, CA (US); Hemant Mungekar, Campbell, CA (US); Guomin Mao, Hayward, CA (US); Rongping Wang, Cupertino, CA (US); Teryl Pratt, Morgan Hill, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 17/125,178

(22) Filed: Dec. 17, 2020

(65) Prior Publication Data

US 2021/0375601 A1 Dec. 2, 2021

Related U.S. Application Data

(63) Continuation-in-part of application No. 16/885,514, filed on May 28, 2020.

(51) Int. Cl.
*H05H 1/00* (2006.01)
*H01J 37/32* (2006.01)

(52) U.S. Cl.
CPC .. *H01J 37/32926* (2013.01); *H01J 37/32357* (2013.01); *H05H 1/00* (2013.01); *H01J 2237/332* (2013.01); *H01J 2237/334* (2013.01); *H01J 2237/335* (2013.01)

(58) Field of Classification Search
CPC  H05H 1/00; H01J 37/32926; H01J 37/32357; H01J 2237/335; H01J 2237/334; H01J 2237/332
See application file for complete search history.

(56) References Cited

U.S. PATENT DOCUMENTS

| | | | |
|---|---|---|---|
| 6,753,689 B1 | 6/2004 | Thomas | |
| 8,691,047 B2 | 4/2014 | Sorensen et al. | |
| 8,723,423 B2 | 5/2014 | Hoffman et al. | |
| 2003/0097984 A1 | 5/2003 | Nakano et al. | |
| 2007/0107750 A1* | 5/2007 | Sawin | C23C 16/4405 134/1.1 |
| 2009/0046989 A1 | 4/2009 | Blonigan et al. | |
| 2010/0098882 A1* | 4/2010 | Lubomirsky | C23C 16/4405 118/723 R |

(Continued)

FOREIGN PATENT DOCUMENTS

| | | | | |
|---|---|---|---|---|
| CN | 103456591 B | 4/2016 | | |
| WO | WO-2006083380 A2 * | 8/2006 | | H01L 21/02321 |

*Primary Examiner* — Henry Luong
(74) *Attorney, Agent, or Firm* — Moser Taboada

(57) ABSTRACT

Methods and apparatus for plasma processing are provided herein. For example, apparatus can include a system for plasma processing including a remote plasma source including a supply terminal configured to connect to a power source and an output configured to deliver RF power to a plasma block of the remote plasma source for creating a plasma and a controller configured to control operation of the remote plasma source based on a measured input power at the supply terminal.

17 Claims, 3 Drawing Sheets

(56) References Cited

U.S. PATENT DOCUMENTS

2011/0308453 A1* 12/2011 Su .................. C23C 16/303
                                              118/708
2014/0346952 A1* 11/2014 Choi ............... H01J 37/32917
                                              315/111.21
2017/0114462 A1    4/2017 Zhang et al.

* cited by examiner

US 11,355,325 B2

METHODS AND SYSTEMS FOR MONITORING INPUT POWER FOR PROCESS CONTROL IN SEMICONDUCTOR PROCESS SYSTEMS

CROSS-REFERENCE TO RELATED APPLICATIONS

The present application is a continuation-in-part of U.S. patent application Ser. No. 16/885,514, filed on May 28, 2020, the entire contents of which is incorporated herein by reference.

FIELD

Embodiments of the present disclosure generally relate to methods and systems for processing a substrate, and more particularly, to a methods and systems for plasma processing using a remote plasma source (RPS).

BACKGROUND

Radio frequency (RF) power can be used to generate plasma (e.g., ammonia ($NH_3$), argon (Ar), etc.) within a plasma block/volume of an RPS. The plasma can be supplied to a plasma processing chamber, e.g., deposition chambers, etch chambers, cleaning chambers, etc., connected to the RPS. The efficiency (e.g., process outcome) of the plasma processing chamber can depend on the RF power delivered to the plasma block/volume within the RPS.

For example, in deposition chambers (e.g., chemical vapor deposition (CVD) chambers, physical vapor deposition chambers (PVD), etc.), a deposition rate (DR) of one or more materials (e.g., silicon oxide (SiO) within the deposition chamber can be affected by the RF power at the plasma block/volume of the RPS. Particularly, the RF power at the plasma block/volume can sometimes deviate from a desired value due to, for example, malfunction, and can affect process outcome. For example, a decrease in RF power at the plasma block/volume can cause a decrease in plasma production, which can affect the DR (e.g., drop in DR) within the deposition chamber. Unfortunately, conventional RPSs, typically, do not include diagnostic and/or monitoring capabilities of RF power at the plasma block/volume.

SUMMARY

Methods and systems for plasma processing are provided herein. In some embodiments, a system for plasma processing includes a remote plasma source including a supply terminal configured to connect to a power source and an output configured to deliver RF power to a plasma block of the remote plasma source for creating a plasma and a controller configured to control operation of the remote plasma source based on a measured input power at the supply terminal.

In accordance with at least some embodiments, a method for plasma processing includes creating a plasma in a remote plasma source configured to couple to a processing chamber for plasma processing and controlling operation of the remote plasma source based on a measured input power at a supply terminal.

In accordance with at least some embodiments, a non-transitory computer readable storage medium having stored thereon instructions that when executed by a processor perform a method for plasma processing. The method includes creating a plasma in a remote plasma source configured to couple to a processing chamber for plasma processing and controlling operation of the remote plasma source based on a measured input power at a supply terminal.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
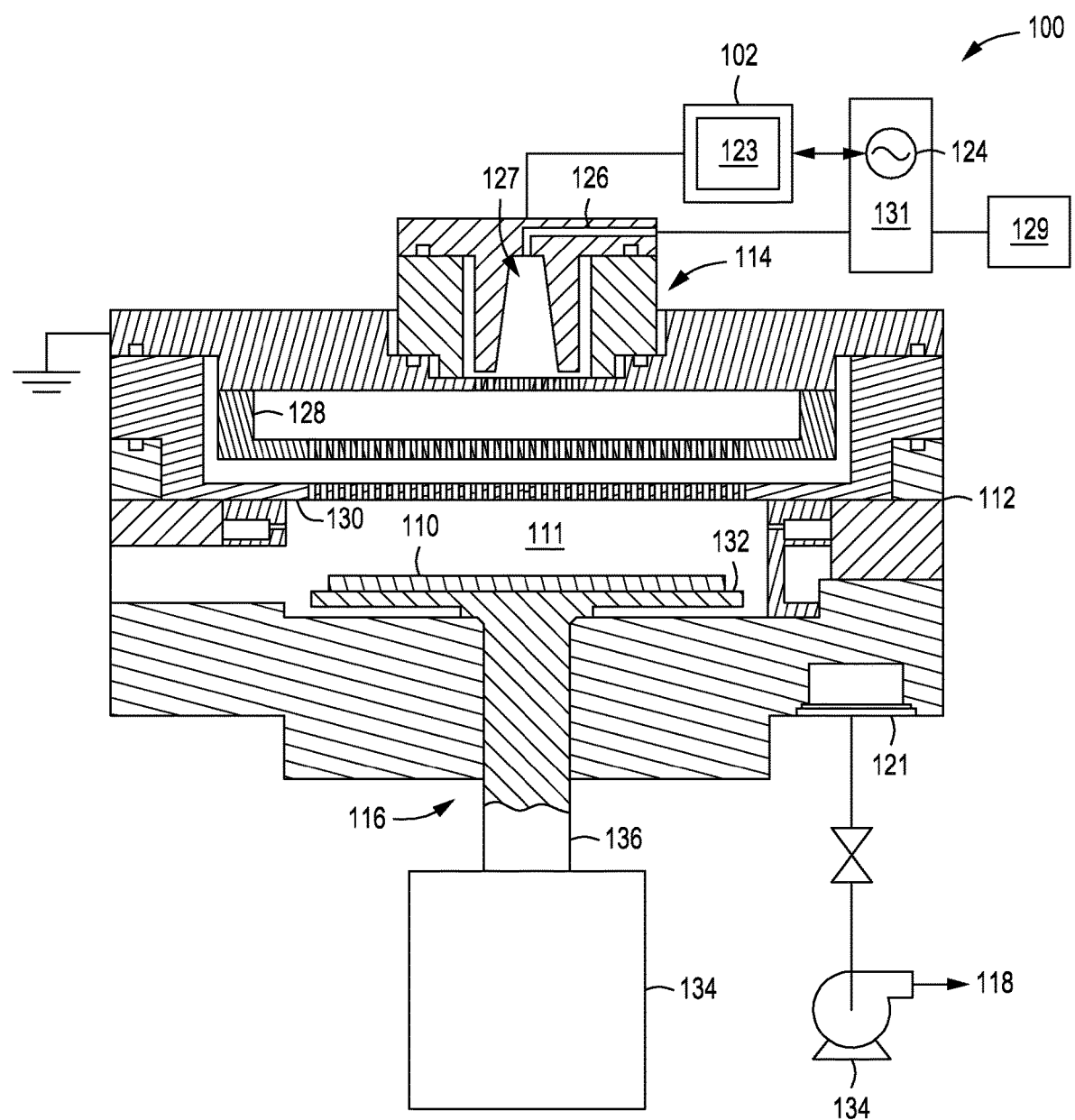
FIG. 1 is a cross-sectional side view of a processing chamber in accordance with at least some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of methods and systems for plasma processing via monitoring of utility power supplied to an RPS are provided herein. For example, in at least some embodiments, plasma processing can include plasma processing a substrate, plasma cleaning a processing chamber (e.g., before and/or after plasma processing the substrate, or as part of routine maintenance, etc.) In at least some embodiments, the present disclosure provides methods and systems for determining RF power at a plasma block/volume of an RPS based on a measured utility power at a supply terminal of the RPS. In at least some embodiments, the method includes using a controller that is connected to the supply terminal of the RPS and configured to determine, based on a predictive model of the RPS, whether the utility power at the supply terminal is equal to a predetermined threshold during processing of a substrate. In at least some embodiments, the predictive model can include a correlation of remote plasma performance with delivered RF power at the output.

FIG. 1 is a cross-sectional side view of a processing chamber 100 in accordance with at least some embodiments of the present disclosure. The processing chamber 100 is configured to perform one or more processes on a substrate 110. For example, in some embodiments, the processing chamber 100 can be a CVD chamber configured to perform a CVD process, a PVD chamber configured to perform a PVD process, a clean or preclean chamber configured to perform a cleaning or preclean process, and/or an etch chamber configured to perform an etching process on a substrate. Apparatus that can be configured for performing a cleaning (e.g., for plasma cleaning a plasma processing volume of a processing chamber, such as before and/or after performing one or more substrate processing procedures, such as, PVD, CVD, ALD, etch, etc.) or an etch process can be, for example, any of the line of apparatus available from Applied Materials, Inc. located in Santa Clara, Calif. Apparatus that can be configured for performing a pre-cleaning process and/or a PVD can be one of the line of PVD apparatus available from Applied Materials, Inc. Apparatus that can be configured for performing a CVD can be one of line of CVD apparatus available from Applied Materials, Inc. Other apparatus available from Applied Materials, Inc., as well as those available from other manufacturers, may also be modified in accordance with the teachings disclosed herein. Such apparatus can be stand-alone apparatus, or one or more of the apparatus can be combined in a cluster tool.

Although the processing chamber 100 may be configured for processing a substrate using other technique as disclosed herein, for illustrative purposes, the processing chamber 100 is assumed to be configured to perform CVD on the substrate 110. Accordingly, in some embodiments, the processing chamber 100 includes a chamber body 112, a lid assembly 114, and a support assembly 116. The lid assembly 114 is disposed at an upper end of the chamber body 112, and the support assembly 116 is at least partially disposed within an inner volume 111 (e.g., a plasma processing volume) defined within the chamber body 112. A vacuum system can be used to evacuate/remove process gases (and/or chemical byproduct) from within the processing chamber 100, and typically includes a vacuum pump 118 coupled to a vacuum port 121 disposed in the chamber body 112.

The lid assembly 114 also includes one or more gas inlets 126 that are connected to one or more RPSs, which are connected to a gas supply 129. The gas supply 129 can supply process gases including, but not limited to, hydrogen ($H_2$), helium (He), argon (Ar), ammonia ($NH_3$), water ($H_2O$), a fluorine containing gas such as nitrogen trifluoride ($NF_3$), hydrogen fluoride (HF), silicon tetrafluoride ($SiF_4$), or any combination thereof.

The one or more RPSs can be any RPS suitable for forming and maintaining a plasma that can be formed using the gas supplied from the gas supply 129. For example, in at least some embodiments, an RPS 131 can be a transformer coupled toroidal plasma source (TCTP), as described in greater detail below.

The RPS 131 is configured to activate (e.g., ignite) the process gas supplied from the gas supply 129 to form plasma. Particularly, an output of a power source 124 (e.g., RF power supply/generator) is provided in the RPS 131 and is configured to ignite the process gas to form and maintain a plasma including ions and radicals within a plasma block of the RPS 131. An operating frequency at the output of the power source 124 can be about 200 kHz to about 400 kHz. The plasma can be introduced from the plasma block of the RPS 131 into the processing chamber 100 via the gas inlets 126, which are in fluid communication with a plasma receiving volume 127 disposed within the lid assembly 114. The plasma is directed from the plasma receiving volume 127 to a surface of the substrate 110 through a blocker plate 128 and a gas distribution plate 130, such as a showerhead.

The support assembly 116 includes a substrate support 132 that has a flat, or a substantially flat, substrate supporting surface for supporting the substrate 110 during processing. The substrate support 132 may be coupled to an actuator 134 by a shaft 136 which extends through a centrally located opening formed in a bottom of the chamber body 112. The actuator 134 may be flexibly sealed to the chamber body 112 by bellows (not shown) that prevent vacuum leakage around the shaft 136. The actuator 134 allows the substrate support 132 to be moved vertically within the chamber body 112 between one or more processing positions and a loading position. The loading position is slightly below an opening of a slit valve (not shown) formed in a sidewall of the chamber body 112 for loading the substrate 110 onto the substrate support 132. The processing positions can be changed as the substrate 110 is being processed. For example, the substrate support 132 can be elevated from a first processing position to a second processing position where the substrate 110 is in close proximity to the lid assembly 114 to control a temperature of the substrate 110, e.g., so that the substrate 110 may be heated via radiation emitted or convection from the gas distribution plate 130.

The processing chamber 100 also includes or is in communication with a controller 102 (or processor) for controlling processes within the processing chamber 100. The controller 102 includes a memory 123 (a non-transitory computer readable storage medium) having stored thereon instructions that when executed cause the controller 102 to perform a method for plasma processing, including any of the methods disclosed herein, as will be described in greater detail below.

Figure 2:
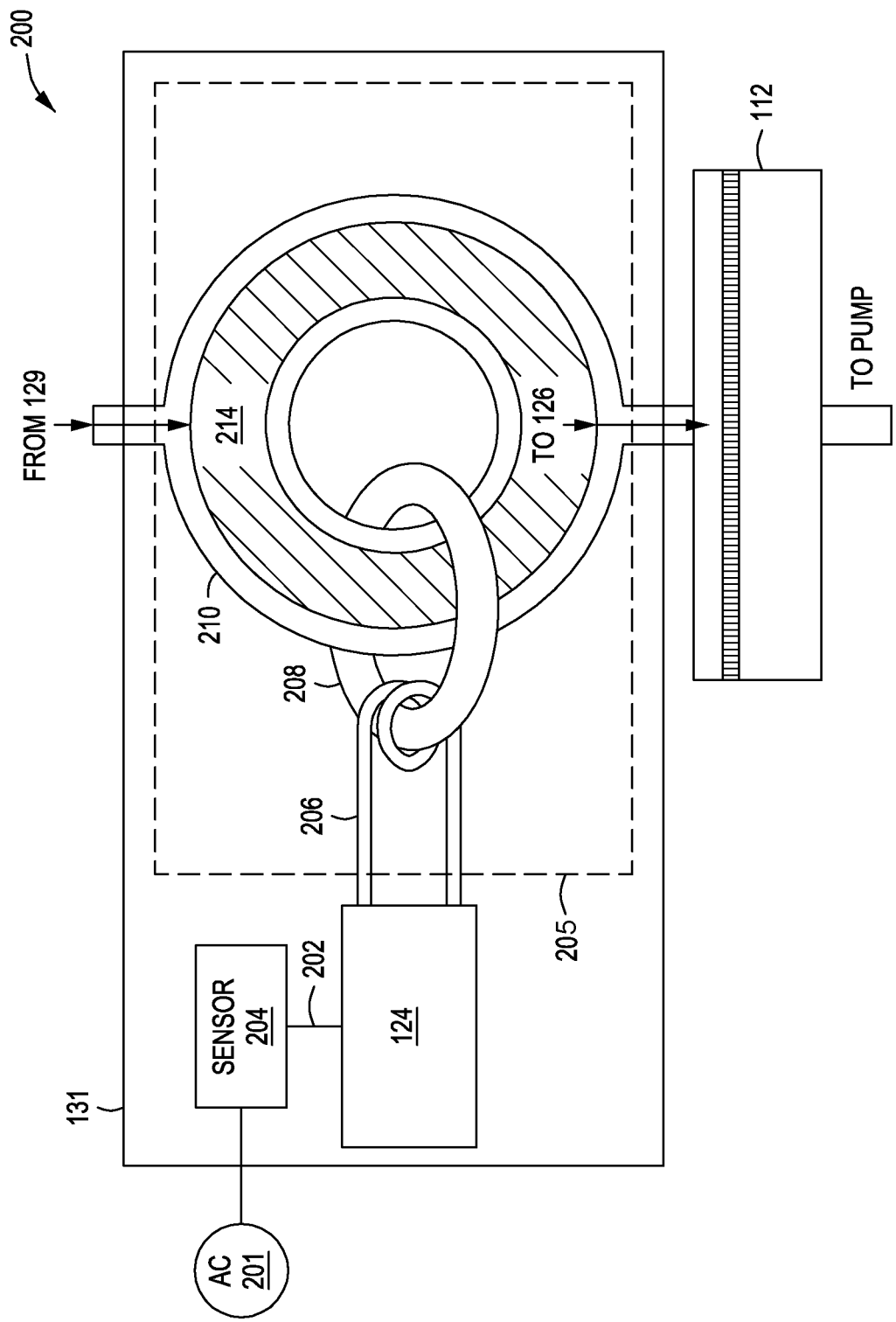
FIG. 2 is a diagram of an RPS in accordance with at least some embodiments of the present disclosure.

FIG. 2 is a diagram of the RPS 131 in accordance with at least some embodiments of the present disclosure.

A supply terminal 202 of the RPS 131 connects to one or more power sources 201 (e.g., utility power source), which can provide AC power (and/or DC power) to the RPS 131. In at least some embodiments, for example, the AC power can be single-phase AC or three-phase AC, which can be provided at a frequency of about 60 Hz or greater. The power from the one or more power sources 201 is used to power at least the power source 124.

A sensor 204 or other device (e.g., a power analyzer) suitable for monitoring/measuring one or more electrical parameters (e.g., voltage, current, resistance, power, etc.) is connected to the supply terminal 202 of the RPS 131. The sensor 204 is configured to provide one or more measured electrical parameters to the controller 102, as described in greater detail below. For example, in at least some embodiments, the one or more electrical parameters can be one of voltage and/or current and can be used to monitor/measure the power from the one or more power sources 201, e.g., being drawn by the RPS 131.

As noted above, in at least some embodiments, the RPS 131 can be a TCTP. Accordingly, in such embodiments, the RPS 131 can include an output 205 that includes a primary winding 206, which can have one or more turns. The primary winding 206 is coupled to a transformer core 208, which can be made from one or more materials suitable for a TCTP (e.g., iron, iron ore, etc.). The transformer core 208 is coupled to a secondary winding 210, which includes a generally circular, hollow configuration, such that an interior volume 214 of the secondary winding 210 functions as a plasma block (volume/cavity) of the RPS 131. More particularly, the interior volume 214 is in fluid communication with the gas supply 129 for receiving a process gas. The process gas is ignited to form plasma when RF energy from the power source 124 is applied to the output 205 of the RPS 131. The plasma is supplied to the plasma receiving volume 127 of the lid assembly 114 via the gas inlets 126, as described above.

Figure 3:
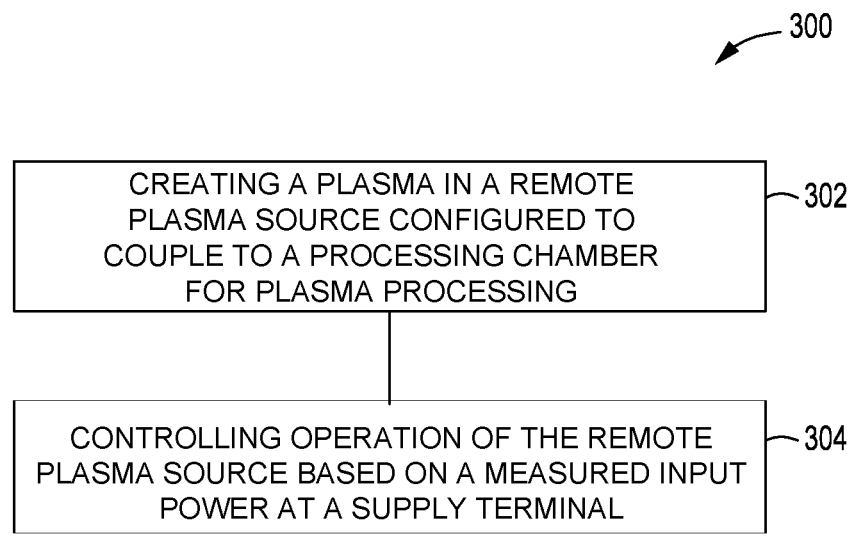
FIG. 3 is a flowchart of a method for processing a substrate in accordance with at least some embodiments of the present disclosure.

The methods and apparatus described herein can be used for one or more various plasma processes. For example, FIG. 3 is a flowchart of a method 300 for plasma processing in accordance with at least some embodiments of the present disclosure. For example, when the method 300 can be used for processing a substrate, the substrate can be any type of substrate, such as a semiconductor substrate (e.g., a silicon, germanium, glass, etc.) used for wafer fabrication, display fabrication, etc. Likewise, the method 300 can be used for performing a plasma cleaning process, such as before and/or after processing of a substrate, routine maintenance, etc.).

Initially, a supply terminal (e.g., the supply terminal 202) of an RPS (e.g., the RPS 131) can be connected to a power source (e.g., the power source 201). For example, in at least some embodiments, the supply terminal can be connected to a utility power source, which can provide one of single-phase AC and/or three-phase AC (e.g., provided at a frequency of about 60 Hz or greater) to the RPS.

Next, at 302, a plasma can be formed in the RPS configured to couple to a plasma processing chamber (e.g., a deposition chamber, such as the processing chamber 100 for processing a substrate). For example, RF power is delivered to a plasma block of the RPS for creating a plasma. For example, in at least some embodiments, one or more process gases can be supplied from a gas supply to the plasma block (e.g. the interior volume 214 of the secondary winding 210) of the RPS and ignited using RF power from the power source (e.g., the power source 124). For example, in at least some embodiments, the RF power can be supplied from the power source at a frequency of about 200 kHz to about 800 kHz.

Next, the plasma is received at the processing chamber connected to the RPS for processing a substrate (e.g., the substrate 110).

For example, in at least some embodiments, the plasma can be supplied from the plasma block of the RPS to a plasma receiving volume (e.g., the plasma receiving volume 127) of the processing chamber e.g., via gas inlets of the processing chamber. As noted above, the plasma can be directed from the processing volume to a surface of the substrate through a blocker plate and a gas distribution plate, e.g., a showerhead. Similarly, the plasma can be directed from the processing volume to one or more surfaces disposed within an inner volume defined within a chamber body. For example, when the plasma process is a plasma cleaning process, e.g., to remove residue, flake, etc., the plasma can be directed toward one or more components/surfaces disposed within the inner volume, e.g., a process kit, a shield, a substrate support, etc.

The inventors have found that a linear correlation exists between the measured power at the supply terminal of the RPS and the RF power delivered to the RPS output. That is, the measured power at the supply terminal of the RPS, and, thus, the RF power delivered to the RPS output is directly related to RPS performance within the processing chamber. For example, if the processing chamber is a PVD chamber, a cleaning chamber, or an etch chamber, RPS performance can be DR, cleaning rate, or etch rate, respectively.

Accordingly, for example, during processing of the substrate or for performing a plasma cleaning process to clean a plasma processing volume (e.g., an inner volume of a processing chamber where plasma processing is performed), at 304, a controller is configured to control operation of the RPS based on a measured input power at the supply terminal. For example, a determination is made as to whether the power at the supply terminal is equal to a predetermined threshold. Particularly, a controller (e.g., the controller 102) connected to the supply terminal of the RPS measures/monitors, using a sensor (e.g., the sensor 204), the power at the supply terminal, and compares a measured power at the supply terminal with a predictive model of the RPS. Accordingly, in at least some embodiments, one or more data look-up tables including information relating to the predictive model for one or more RPSs can be stored in a memory (e.g., the memory 123) of the controller. The information relating to the predictive model of the one or more RPSs can include, but is not limited to, a predetermined power threshold at the supply terminal for a specific RPS, a type of RPS, optimal RF power output ratings of an RPS including corresponding frequencies for forming and maintaining a plasma within the plasma block and a corresponding power input at the supply terminal of an RPS, a range of threshold values corresponding to an acceptable measured power at the supply terminal for an RPS, a DR, a cleaning rate, an etch rate, and the like corresponding to optimal RF power output of an RPS, etc. The controller can use the information stored in the one or more data look-up tables at 304. For example, in at least some embodiments, at 304 the controller compares the measured power at the supply terminal with a predetermined power threshold at the supply terminal for a specific type of RPS.

Based on a determination of the predetermined threshold being met, the controller is configured to control plasma processing. For example, in at least some embodiments, if the controller determines that the power at the supply terminal of the RPS is equal to the predetermined threshold, the controller can be configured to continue plasma processing (e.g., at an adequate DR, cleaning rate, etch rate, and the like). Conversely, if the controller determines that the power at the supply terminal is not equal to the predetermined threshold, the controller can be configured to adjust an electrical parameter as needed in the remote plasma source (and/or the processing chamber) to increase a power at the supply terminal of the RPS, stop plasma processing, and/or transmit an alert to a user (e.g., audio, visual, etc.).

While the foregoing is directed to embodiments of the present disclosure, other and further embodiments of the disclosure may be devised without departing from the basic scope thereof.

The invention claimed is:

1. A system for plasma processing, comprising:
a remote plasma source including a supply terminal configured to connect to a power source and an output configured to deliver RF power to a plasma block of the remote plasma source for creating a plasma; and
a controller configured to control operation of the remote plasma source based on a measured input power at the supply terminal,
wherein the controller is further configured to determine, using a predictive model of the remote plasma source, whether the measured input power at the supply terminal meets a predetermined threshold during the plasma processing, wherein the predictive model includes a correlation of remote plasma performance with the delivered RF power at the output, and to control the plasma processing based on a determination of the predetermined threshold being met.

2. The system of claim 1, wherein the controller is further configured to:
if the input power at the supply terminal is equal to the predetermined threshold, continue the plasma processing; and
if the input power at the supply terminal is not equal to the predetermined threshold, at least one of adjust an electrical parameter in at least one of the remote plasma source or a processing chamber, stop the plasma processing or transmit an alert to a user.

3. The system of claim 2, wherein the electrical parameter is at least one of voltage or current.

4. The system of claim 1, wherein the remote plasma source is connected to a processing chamber, wherein the processing chamber is one of a deposition chamber, a cleaning chamber, or an etch chamber, and wherein remote plasma performance is one of a deposition rate, a cleaning rate, or an etch rate, respectively.

5. The system of claim 4, wherein the controller is further configured to at least one of process a substrate or clean a plasma processing volume of the processing chamber.

6. The system of claim 1, wherein the power source is configured to provide at least one of single-phase AC or three-phase AC at a frequency of about 60 Hz or greater.

7. The system of claim 1, wherein the RF power delivered from the output of the remote plasma source is delivered at about 200 kHz to about 800 kHz.

8. A method for plasma processing comprising:
creating a plasma in a remote plasma source configured to couple to a processing chamber for plasma processing;
controlling operation of the remote plasma source based on a measured input power at a supply terminal;
determining, using a predictive model of the remote plasma source, whether the measured input power at the supply terminal meets a predetermined threshold during the plasma processing, wherein the predictive model includes a correlation of remote plasma performance with the delivered RF power at the output; and
based on a determination of the predetermined threshold being met, controlling the plasma processing.

9. The method of claim 8, further comprising:
if the input power at the supply terminal is equal to the predetermined threshold, continuing the plasma processing; and
if the input power at the supply terminal is not equal to the predetermined threshold, at least one of adjusting an electrical parameter in at least one of the remote plasma source or the processing chamber, stopping the plasma processing, or transmitting an alert to a user.

10. The method of claim 9, wherein adjusting the electrical parameter comprises adjusting at least one of voltage or current.

11. The method of claim 10, wherein delivering the RF power from the output of the remote plasma source is delivered at about 200 kHz to about 800 kHz.

12. The method of claim 8, wherein the processing chamber is one of a deposition chamber, a cleaning chamber, or an etch chamber, and wherein remote plasma performance is one of a deposition rate, a cleaning rate, or an etch rate, respectively.

13. The method of claim 8, wherein the plasma processing comprises processing a substrate or cleaning a plasma processing volume of the processing chamber.

14. The method of claim 8, wherein the input power at the supply terminal is provided by a power source configured to provide at least one of single-phase AC or three-phase AC at a frequency of about 60 Hz or greater.

15. A non-transitory computer readable storage medium having stored thereon instructions that when executed by a processor perform a method for plasma processing comprising:
creating a plasma in a remote plasma source configured to couple to a processing chamber for plasma processing;
controlling operation of the remote plasma source based on a measured input power at a supply terminal;
determining, using a predictive model of the remote plasma source, whether the measured input power at the supply terminal meets a predetermined threshold during the plasma processing, wherein the predictive model includes a correlation of remote plasma performance with the delivered RF power at the output; and
based on a determination of the predetermined threshold being met, controlling the plasma processing.

16. The non-transitory computer readable storage medium of claim 15, further comprising:
if the input power at the supply terminal is equal to the predetermined threshold, continuing the plasma processing; and
if the input power at the supply terminal is not equal to the predetermined threshold, at least one of adjusting an electrical parameter in at least one of the remote plasma source or the processing chamber, stopping the plasma processing, or transmitting an alert to a user.

17. The non-transitory computer readable storage medium of claim 16, wherein adjusting the electrical parameter comprises adjusting at least one of voltage or current.

* * * * *